(12) United States Patent
Rubin et al.

(10) Patent No.: US 12,119,335 B2
(45) Date of Patent: Oct. 15, 2024

(54) INTERCONNECTION STRUCTURES FOR HIGH BANDWIDTH DATA TRANSFER

(71) Applicant: International Business Machines Corporation, Armonk, NY (US)

(72) Inventors: Joshua M Rubin, Albany, NY (US); Steven Lorenz Wright, Tucson, AZ (US); Arvind Kumar, Chappaqua, NY (US); Mounir Meghelli, Tarrytown, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/552,754

(22) Filed: Dec. 16, 2021

(65) Prior Publication Data

US 2023/0197705 A1 Jun. 22, 2023

(51) Int. Cl.
*H01L 25/18* (2023.01)
(52) U.S. Cl.
CPC ................................. *H01L 25/18* (2013.01)
(58) Field of Classification Search
CPC ......... H01L 25/18; H01L 25/10; H01L 25/11; H01L 25/12; H01L 25/13; H01L 25/0652; H01L 25/042; H01L 25/043; H01L 23/5383; H01L 25/0655; G06F 13/00
See application file for complete search history.

(56) References Cited

U.S. PATENT DOCUMENTS

| | | | |
|---|---|---|---|
| 6,377,581 B1 | 4/2002 | Anand et al. | |
| 6,600,364 B1 | 7/2003 | Liang et al. | |
| 7,031,347 B2 | 4/2006 | Spooner | |
| 7,961,705 B2 | 6/2011 | Kennedy et al. | |
| 8,546,955 B1* | 10/2013 | Wu | H01L 23/5384 257/777 |
| 9,251,108 B2 | 2/2016 | Bass et al. | |
| 9,633,872 B2 | 4/2017 | Chen et al. | |
| 9,875,956 B1* | 1/2018 | Sauter | H01L 24/04 |

(Continued)

FOREIGN PATENT DOCUMENTS

WO WO2018125767 5/2018

OTHER PUBLICATIONS

Intel Stratix 10 with EMIB—https://www.anandtech.com/show/12477/intel-launches-stratix-10-tx-leveraging-emib-with-58g-transceivers-.

(Continued)

*Primary Examiner* — Peter M Albrecht
(74) *Attorney, Agent, or Firm* — L. Jeffrey Kelly

(57) ABSTRACT

Embodiments of one or more high bandwidth chips (HB chips), e.g., high bandwidth memories (HBMs), are mounted on a module substrate. The HB chips/HBMs each have one or more HBM parallel communication interfaces (HB chip PHYs or HBM PHYs, respectively) that are connected to a companion PHY through a compatible companion PHY parallel connection that enable communication between the HBM PHY and the companion PHY. A companion PHY parallel link connection connects to a SERDES parallel connection of a SERDES. The SERDES converts parallel data/information at the SERDES parallel connection to serial data/information at a SERDES serial connection, and visa-versa, that enables efficient high bandwidth data transfer over longer distances. Alternative embodiments are disclosed.

21 Claims, 8 Drawing Sheets

(56) References Cited

U.S. PATENT DOCUMENTS

| | | | |
|---|---|---|---|
| 9,971,733 | B1 | 5/2018 | Teh et al. |
| 10,255,109 | B2 | 4/2019 | Koker et al. |
| 10,410,694 | B1 | 9/2019 | Arbel et al. |
| 10,748,601 | B2 | 8/2020 | Kim et al. |
| 2012/0248569 | A1* | 10/2012 | Jenkins ............ H01L 23/49822 257/531 |
| 2018/0294251 | A1* | 10/2018 | Liu .................... H01L 25/0657 |
| 2019/0227963 | A1 | 7/2019 | Ooi et al. |
| 2020/0144186 | A1* | 5/2020 | Thomas ............. H01L 23/5381 |
| 2021/0043588 | A1* | 2/2021 | Wang .................... H01L 23/66 |
| 2021/0109873 | A1* | 4/2021 | Lee .................... G06F 13/1668 |

OTHER PUBLICATIONS

Micron HMC—https://static6.arrow.com/aropdfconversion/a034c723e572f45efe84162a58a14f71cedf33fa/hmc_webinar_july_2017.pdf.pdf.

Kaist—K. Cho et al., "Signal Integrity Design and Analysis of Silicon Interposer for GPU-Memory Channels in High-Bandwidth Memory Interface," in IEEE Transactions on Components, Packaging and Manufacturing Technology, vol. 8, No. 9, pp. 1658-1671, Sep. 2018.

AMD—D. Stow, Y. Xie, T. Siddiqua and G. H. Loh, "Cost-effective design of scalable high-performance systems using active and passive interposers," 2017 IEEE/ACM International Conference on Computer-Aided Design (ICCAD), Irvine, CA, 2017, pp. 728-735.

Timothy Dickson, et al., A 1.8-pJ/bit 16×16-GB/s Source Synchronous Parallel Interface in 32 nm SOI CMOS with Receiver Redundancy for Link Recalibration, IBM T. J. Watson Research Center, Yorktown Heights, NY, USA, 978-1-4799-8682-8/15/$31.00 (c) 2015 IEEE.

Sally Ward-Foxton, Sep. 1, 2021, EE Times, "Solving AI's Memory Bottleneck", https://www.eetimes.com/solving-ais-memory-bottleneck/.

Micron/HMC, Stephan von Appen, Mikko Hotti, "Hybrid Memory Cube", Webinar Jul. 2017.

Micron, "Hybrid Memory Cube Your New Standard for Memory Performance", Nov. 26, 2013.

* cited by examiner

INTERCONNECTION STRUCTURES FOR HIGH BANDWIDTH DATA TRANSFER

BACKGROUND

The present invention relates to hardware components and structures for high bandwidth transfer of data.

Numerous applications such as accelerators, graphical processing units (GPUs) with high bandwidth memory (HBMs), split microprocessor chips, and other heterogeneous integration schemes require High Density Interconnect (HDI) solutions with high bandwidth, low latency, and low power to communicate data to and from a HBM, other Memory Module, and/or semiconductor chip with one or more high bandwidth connections. Commodity chips/memories, such as HBMs, are designed to only transfer across a short interconnection length. Limiting the interconnection length limits the number of memories/chips that can be placed around a central die (e.g., source and/or destination of data) and therefore limits the amount of data memory storage and aggregate (memory) bandwidth available.

Limitations on high bandwidth data transfer, e.g., due to data link/connection length limitations, have negative impacts where HBMs are used, i.e., in 3D-stacked dynamic random-access memory (DRAM), graphics applications (GPUs), high-performance computing (HPC), server applications, etc.

SUMMARY

Embodiments of the invention are memory/chip modules and/or packages of memories/chips that enable dense packing of the memories (and/or chips) with high bandwidth connections in proximity with central dies to increase bandwidth of communication between a plurality of the memories/chips and one or more of the central dies.

One or more high bandwidth semiconductor chips (HB chips), like high bandwidth memories (HBMs), are mounted on a HB module substrate to create a variety of HBM/HB chip modules. (HBMs include a wide range of memory types.) The HBMs/HB chips each have one or more HBM/HB chip physical parallel communication interfaces (HBM PHYs or HB chip PHYs, respectively). Each of the HBM PHYs is connected to a companion PHY through a compatible companion PHY parallel connection that enables communication between the HBM PHY and companion PHY. The companion PHY has a companion PHY parallel link connection. The companion PHY parallel link connection can be a standardized or customized parallel connection.

In some embodiments, e.g., where the HBM/companion PHY is close to the central die, the companion PHY parallel link connection directly connects to a central die parallel connection on the central die. (Designs of the companion PHY parallel link and the central die parallel connection are selected to insure connectivity, compatibility, and operability.) In other embodiments, e.g., where the HBM/companion PHY is far from the central die, the companion PHY parallel link connection connects to a SERDES parallel connection of a SERDES.

The SERDES converts parallel data/information at the SERDES parallel connection to serial data/information at a SERDES serial connection, and visa-versa. In embodiments where the HBM/companion PHY is far from the central die, the SERDES serial connection is connected to a central die SERDES (on the central die) through a serial communication link which communicates data/information in serial format between the SERDES and the central die. The serial communication link has a long communication distance and enables more dense packing of the HBMs and/or HBM modules (and/or HB chips and/or HB chip modules) in proximity to and around the central die because more of the HBMs/HBM modules (and/or HB chips and/or HB chip modules) can be positioned further from the central die.

In embodiments with HBM modules that carry no central die and/or connect to external central dies, connections are made to the central die through easily accessible distant Input/Outputs (I/O), e.g., located on one or more surfaces of the HBM (HB chip) module substrate. In some embodiments, the distant I/Os are physical connections/connectors that can be of standardized or custom design. The distant I/Os enable the central die(s) to connect directly to the companion PHY parallel link connection(s) and/or the SERDES serial connection(s) (e.g., through the central die SERDES).

Alternative embodiments are HBM modules (and/or HB chip modules) with various combinations of serial and parallel interfaces, different HBM/HB chip configurations, and different types and locations of distant I/Os.

Components, e.g., HBM PHYs, companion PHYs, SERDES, and central die SERDES, are selected so that the HBM modules (HB chip modules) can be connected through the distant I/Os to ensure compatibility, conductivity, and interoperability when connecting the HBM modules (and/or HB chip modules) and central dies to form HBM/HB chip packages on a package substrate(s).

In some embodiments, the companion PHY enables a compatibility between the HBM PHY (HB chip PHY) and SERDES and/or the central die SERDES. Non-limiting examples of companion PHYs include Intel's AIB (Advanced interface bus), TSMC's LIPINCON, and OCP's BoW (Bunch of Wires).

BRIEF DESCRIPTION OF THE DRAWINGS

Various embodiments of the present invention will be described below in more detail, with reference to the accompanying drawings, now briefly described. The Figures show various apparatus, structures, and related method steps of the present invention.

DETAILED DESCRIPTION

Figure 1:
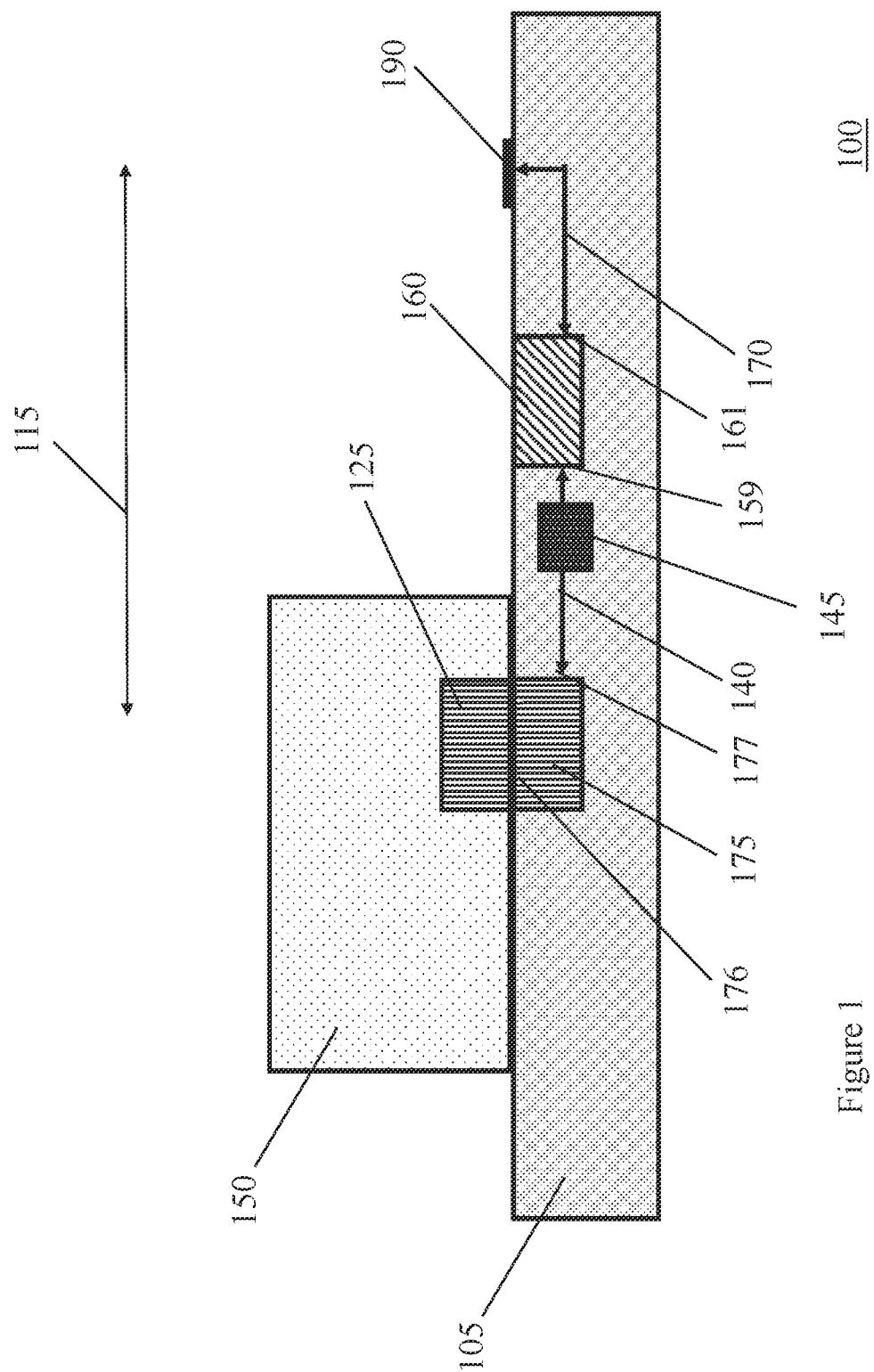
FIG. 1 is a block diagram of one embodiment of a high bandwidth memory (HBM) module (or HB chip module) with one or more HBMs (or high bandwidth chips, HB chips) mounted on a HBM module substrate and where each of the HBMs/HB chips has one or more HBM PHYs (Physical Layers) connected through a companion PHY to a SERDES and a serial communication interface/connection at a distant input/output (distant I/O).

It is to be understood that embodiments of the present invention are not limited to the illustrative methods, apparatus, structures, systems, and devices disclosed herein but instead are more broadly applicable to other alternative and broader methods, apparatus, structures, systems, and devices that become evident to those skilled in the art given this disclosure.

In addition, it is to be understood that the various layers, structures, and/or regions shown in the accompanying drawings are not drawn to scale, and that one or more layers, structures, and/or regions of a type commonly used may not be explicitly shown in a drawing. This does not imply that the layers, structures, and/or regions not explicitly shown are omitted from the actual devices.

In addition, certain elements may be left out of a view for the sake of clarity and/or simplicity when explanations are not necessarily focused on such omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices, structures, and methods disclosed in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, expert and artificial intelligence systems, functional circuitry, neural networks, etc. Systems and hardware incorporating the semiconductor devices and structures are contemplated embodiments of the invention.

As used herein, "height" refers to a vertical size of an element (e.g., a layer, trench, hole, opening, component, etc.) in the cross-sectional or elevation views measured from a bottom surface to a top surface of the element, and/or measured with respect to a surface on which the element is located. Terms such as "thick", "thickness", "thin" or derivatives thereof may be used in place of "height" where indicated.

Conversely, a "depth" refers to a vertical size of an element (e.g., a layer, trench, hole, opening, etc.) in the cross-sectional or elevation views measured from a top surface to a bottom surface of the element.

As used herein, "lateral," "lateral side," "side," and "lateral surface" refer to a side surface of an element (e.g., a layer, opening, component, etc.), such as a left or right-side surface in the drawings.

As used herein, "width" or "length" refers to a size of an element (e.g., a layer, connection, hole, opening, component, etc.) or distance in the drawings measured from a side surface to an opposite surface of the element or as indicated in the drawing. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the elevation views, and "horizontal" refers to a direction parallel to the top surface of the substrate in the elevation views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop," "disposed on," or the terms "in contact" or "direct contact" means that a first element and a second element are connected without any intervening elements, such as, for example, intermediary conducting, insulating or semiconductor layers, present between the first element and the second element.

It is understood that these terms might be affected by the orientation of the device described. For example, while the meaning of these descriptions might change if the device was rotated upside down, the descriptions remain valid because they describe relative relationships between features of the invention.

Various embodiments of high bandwidth memory (HBM) modules are disclosed that enable more dense packing and placement of HBMs (and/or HB chips) around or in proximity with central dies. Using HBM modules increases HBM density around a central die/chip and increases bandwidth of data/instructions communicated with the central die/chip. In addition, the HBM modules require less central chip perimeter ("beachfront") to be used for data connections and the central die surface area needed for data I/O is reduced.

It is noted that the term HBM used in this disclosure is not a specific memory specification. It is contemplated that the term HBM also includes any high bandwidth semiconductor chip (HB chip), e.g., a semiconductor chip with one or more high bandwidth connections. HB chips include a high bandwidth memory (HBM) but also include other chips with high bandwidth connections. It is understood that the invention enables denser packing and increased bandwidth using general HB chips, including non-limiting examples of high bandwidth memory (HBMs) memory types, including, but not limited, to: memory stacks, dynamic random access memories (DRAMs), static random access memory (SRAM), magnetoresistive random access memory (MRAM), memories under the Joint Electron Device Engineering Council (JEDEC) standards, memory chips, etc. The use of the term HBM and the term HBM module includes HB chips, that may or may not be memories, without loss of generality.

The HBM modules enable architectures where large numbers of HBM can communicate with central dies using reduced substrate area around the central die. "Commodity" HBMs can be used in the HBM modules to achieve large/expanded memory access to central dies with no additional specialized circuitry. Companion PHYs can be used to match interfaces between HBMs and central dies.

Various embodiments and configurations of HBM modules are disclosed. Different instantiations of the HBM modules are combined to create HBM packages with different combinations of serial and parallel data connections between individual HBMs (and/or HB chips) and the central die(s). In some embodiments, the communication distances of the serial and/or parallel data connections is increased.

In some embodiments, data/information is communicated between individual HBMs and the central die over parallel input/outputs (I/O), e.g., when the respective HBMs are close to the central die. Alternatively, data/information is communicated between individual HBMs (and/or HB chips) and the central die over serial I/O, e.g., when the respective HBMs (and/or HB chips) are further distances from the central die. Architectures and structures are disclosed that enable various combinations of parallel and serial I/O connections/interfaces between HBMs (and/or HB chips) and central die(s) to enable large numbers of HBMs (and/or HB chips) to communicate with and be in proximity to a given central die.

Embodiments include structures and methods for using multiple input/output (IO) protocols like parallel Input/Output (IO) links and high-speed serials links to overcome the communication limitations of commodity high bandwidth memories (HBMs) and/or HB chips.

High bandwidth data transfer is needed in more and more applications like artificial intelligence (AI), 3D-stacked DRAM (dynamic random-access memory), graphic processing and graphical user interfaces (GPUs), high-performance computing (HPC), server applications, etc. By using different configurations of HBM modules (and/or HB chip modules), bandwidth is increased by packing HBMs more densely around a central die communicating data with the HBMs. Compatibility and operability of connections and interfaces is ensured and assembly of complex HBM packages (and/or HB chip packages) on package substrates by interconnecting HBM modules (and/or HB chip modules) and central dies is enabled.

Note that the term "central chip or die" refers to a semiconductor chip that communicates (inputs data, information, and instructions from and provides data, information, and instructions to) one or more HBMs (HB chips) through input/output (I/O) interfaces, e.g., serial I/O and/or parallel I/O. Central dies/chips can include accelerator chips (accelerators), central processor units (CPUs), graphical processing units (GPUs), field programmable gate arrays (FPGAs), etc. Throughout this disclosure, central dies can be identified also as these components without loss of generality.

I/O interfaces include both parallel and serial interfaces. Parallel data interfaces typically have the same number of dataline inputs as dataline outputs. Serial data interfaces typically have a higher number of dataline inputs than dataline outputs. Other configurations are possible. For example, many inputs on one chip can be condensed into a few outputs where those few outputs are sent to another chip to be expanded to many outputs.

Generally, parallel interfaces have less latency than serial interfaces. However, parallel interfaces communicate data over shorter distances than serial interfaces. In this disclosure, "near" will mean a distance that data can be effectively communicated over a parallel data interface/connection and "far" will mean a distance that data cannot be effectively communicated over a parallel data interface/connection. Alternatively, a HBM (HB chip) and central die are considered "near" to one another if their connections are within 7 or 8 millimeters (mm) or less and the HBM (HB chip) and central die are considered "far" from one another if their connections are further than that distance, 8 mm. In some instances, far is greater than 50 mm. In some instances, "near" is less than 50 mm or even less than 8 mm.

Effective parallel data communication distances between HBMs/HB chips and central dies are limited to 7 or 8 mm or less. This limited communication distance of the HBMs causes crowding of the HBMs around central dies communicating with the HBMs. This crowding occupies valuable chip perimeter or "chip beachfront" of the central die and requires that more central die surface area is used for an increased number of I/O interfaces. Accordingly, the bandwidth of data communication between the HBMs and the central die is also limited because fewer HBMs can be configured or packed close to the central die.

Serial datalines (links, communication links, or connections) are used to communicate over far distances. Serial data communication is enabled by using serializers and deserializers (SERDES). A SERDES combined with a physical coding sublayer (PCS) makes up a physical layer (PHY).

SERDES and PHYs are known. SERDES and PHYs convert data from parallel data/interfaces into serial data and/or visa-versa. SERDES chips are used in Gigabit Ethernet systems, wireless network routers, fiber optic communication systems, storage applications, etc. An example of a SERDES PHY layer is the PCI Express (PCIe) SerDes PHY. PCIe® is a registered trademark and/or service mark of the Peripheral Component Interconnect Special Interest Group (PCI-SIG®). In this description, the parallel formatted interface(s) of the SERDES is called the SERDES parallel connection(s) and the serial formatted interface(s) of the SERDES is called the SERDES serial connection(s). SERDES are known as functional blocks that serialize and deserialize digital data used in high-speed chip-to-chip communication, including but not limited to memory chips.

Sometimes "PHY" refers to the first physical layer in the Open Systems Interconnection (OSI) model of computer networking. This layer implements the transmission and reception of raw bit streams over a physical medium. The PHY may be contained within a chip, at times providing other functions, or the PHY may be implemented by a separate PHY chip.

By increasing the communication distance between the HBMs and central dies, more HBMs can be positioned/packed around the central die thereby increasing the data bandwidth.

Various combinations of serial and parallel interfaces are used to communicate data/instructions between HBMs and central dies. Different embodiments of HBM module and HBM package structures are disclosed that enable increased HBM packing in proximity to central dies and efficient, compatible, and operable connections between the HBMs and central die(s). The structures enable customized circuit creation using commodity, "off-the-shelf," HBMs with little or no extra circuitry. Alternative HBM module/package embodiments include using passive and/or passive bridges and/or active and/or passive interposers together with one or more central chips to provide a more straightforward integration approach for the custom communication strategies.

(A bridge technology is a communication link (physical piece of silicon or other material that contains traces and/or other components) that connects to at least the edge of the dies that are joined to the bridge and communicating via the bridge. The bridge may even encompass/fully support one of the dies. An interposer supports all dies fully. Additionally, the word "active", e.g., active bridge or active interposer, refers to additional circuitry in the bridge/interposer, beyond just passive components such as resistors and capacitors, etc. Active interposers are also referred to as 3D chips.)

Refer now to the Figures.

FIG. 1 is a block diagram of one embodiment of a high bandwidth memory (HBM) or HB chip module 100 with one or more HBMs (HB chips) 150 mounted on a HBM module substrate 105. Each of the HBMs 150 (HB chips 150) has one or more PHYs (Physical Layers), HBM PHYS, 125 connected through a companion PHY 175 to a SERDES 160. The companion PHY 175 is a known physical layer that connects to a SERDES 160 through a communication link 140. The SERDES 160 produces serialized data from the parallel data outputted by the respective HBM 105 and companion PHY 175, and visa-versa to create a serial link/serial connection 170. In this embodiment, the serialized data produced by SERDES 160 connects through a serial link 170 to a distant I/O 190. The companion PHY 175 has interfaces compatible and operable with the HBM PHY 125 and SERDES 160 to which it connects to ensure compatibility and operability of data/information communication between the HBM 150 and the distant I/O 190.

For example, each of the HBM PHYs 125 is connected to a companion PHY through a compatible companion PHY 175 parallel connection 176 that enables communication between the HBM PHY 125 and companion PHY 175. The companion PHY 175 has a companion PHY parallel link connection 177. The companion PHY parallel link connection 177 can be a standardized or customized parallel connection.

The companion PHY parallel link connection 177 can connect to a SERDES parallel connection(s) 159 of the SERDES 160. A SERDES serial connection(s) 161 of the SERDES 160 is connected to the (serial) communication link 170.

As stated above, the HBMs 150 can be any known memory semiconductor and/or stack of memory semiconductors 150 and/or HB chip 150 and/or stack of HB chips 150, without loss of generality. The HBM 150 will have at least one parallel input/output (I/O) 125, typically a HBM PHY 125. The companion PHY 175, in one embodiment, is located within the module substrate 105. The companion PHY 175 is designed so the interface 176 between the HBM PHY 125 and the companion PHY 175 is compatible/operable.

Note that embodiments of the links 140 and 170 are bi-directional. This means that parallel data passes through the serial link 140 as bi-directional parallel data from the companion PHY 175 to the SERDES 160, and visa-versa, and information as bi-directional serial data passes between the SERDES 160 and the distant I/O 190 as serial data. Also, serial data from the distant I/O 190 passes through the SERDES 160 and is communicated as parallel data over parallel link/connection 140 to the companion PHY 175 and back to the HBM 150. In some embodiments, the distant SERDES I/O 190 is located a far communication distance 115 from the companion PHY 175, i.e., between 8 and 50 millimeters (mm) away 115. In some embodiments, the serial links can communicate off-module.

Note that the companion PHY 175 and SERDES 160 are shown as two separate components. However, embodiments exist where the companion PHY 175 and SERDES 160 are combined. Other enhancements to the module substrate 105 are envisioned.

The HBM module substrate 105 can be any known type of substrate, for example, made of materials such as epoxy, resin, dielectric polymer, polyimide, polyimide alloy or compounds, ceramic, semiconductors, silicon, and/or other similar materials. Module substrates 105 can also be made from laminates. The module substrates 105 are often active or passive bridges, interposers, hybrid interposes/bridges, or other semiconductor substrates.

The module substrate 105 may contain active and/or passive bridges or interposers individually or in combination with other substrates, e.g., laminates and/or advanced laminates.

The module substrates 105 organize, hold, and carry the HBMs 150 (and other components) attached to (and sometimes within) the respective module substrates 105. One or more of these module substrates 105 can be physically arranged, aligned, and connected with central dies on package substrates to form HBM packages, described below.

Embodiments of the HBM module substrate 105 can be active or passive. Communication links, e.g., 140/170, can pass through the HBM module substrate 105. Active components, e.g., companion PHYs 175, SERDES 160, and transistors (not shown) can be within a HBM module substrate 105 as well as passive components like resistors and capacitors (not shown). Known memory controllers 145 can also reside in the module substrate 105, e.g., connected in parallel connection 140 between the companion PHY 175 and the SERDES 160. Each of the memory controllers 145 controls one or more of the HBMs 150. In some embodiments, the HBM module substrate 105 is one or more active or passive bridges or interposers. Other architectures are envisioned.

The HBM module 100 can use a generic HBM (and/or HB chip) with a parallel I/O, like HBM PHY 125. The HBM module 100 extends the communication distance 115 from the HBM PHY 125 to a standard distant I/O 190. As discussed below, alternative embodiments, extend the communication distance 115 (between the HBM PHY 125 and the distant I/O 190) of the HBM module 100 in different ways, e.g., using an active bridge 105 with buffers in the HBM module substrate 105 and/or using combinations of HBM PHYs 125, companion PHYs 175, and SERDES 160.

A SERDES chip, e.g., a 3D SERDES, 160 chip can be stacked below, adjacent to, or otherwise with the companion PHY 175. These configurations reduce power needed to produce the serial data interface at the distant SERDES I/O 190. Efficiencies are also enabled with a shortened interconnect distance between the HBM chip 150 and the companion PHY 175. As an example, shorter interconnects have less capacitance and can be driven with less current. Alternatively, an adjacent 2.5D SERDES chip can convert parallel I/O data to serial I/O data at the distance I/O 190. Note embodiments are envisioned where the SERDES 160 and/or companion PHY 175 can be located within or on the module substrate 105, e.g., an active/passive bridge(s) or interposer(s). Embodiments are also envisioned where the parallel connection 140 is very short or zero in length. Example, alternative embodiments are given below.

The HBM module 100 enables a commodity part, such as an HBM (HB chip) 150, designed with a limited, short distance parallel IO connection, an HBM PHY125, to communicate with a more distant, central die over a standard serial data connection 170/190. As is disclosed below, the HBM module 100 enables numerous configurations using standard HBMs 150 to increase the number, density, and positioning of HBMs 150 communicating with one or more central dies.

There are many embodiments of the HBM module 100 envisioned. For example, the HBM module 100 contains at least one memory chip (HBM), and/or HB chip 150, and/or stack of HBMs, and/or stack of HB chips 150, and one serial link 170. The SERDES 160 may be an adjacent chip 160 located on the module substrate 105 or a 3D chip configuration placed underneath the HBM 150 within the module substrate 105. Embodiments of the HBM module 100 may contain multiple HBMs (HB chips) 150, each with their own serial links 170. Also, multiple HBMs (and/or multiple HB chips) 150 may each share an SERDES chip 160 with multiple serial links 170.

The HBM module 100 transforms the parallel IO 125 from the HBM 150 to a serial IO 170 for on-module standard serial I/O communication available at the distant I/O 190. Embodiments of the distant I/O 190 are easily accessible for connection to other components like central dies.

In an alternate embodiment described below, an active bridge 105 may provide a means for keeping the HBM I/O 125 in a parallel I/O topology, with buffers and other necessary components inserted therein for longer distance 115 communication. In these embodiments, one or more of the distant I/Os 190 would be in parallel format.

Figure 2:
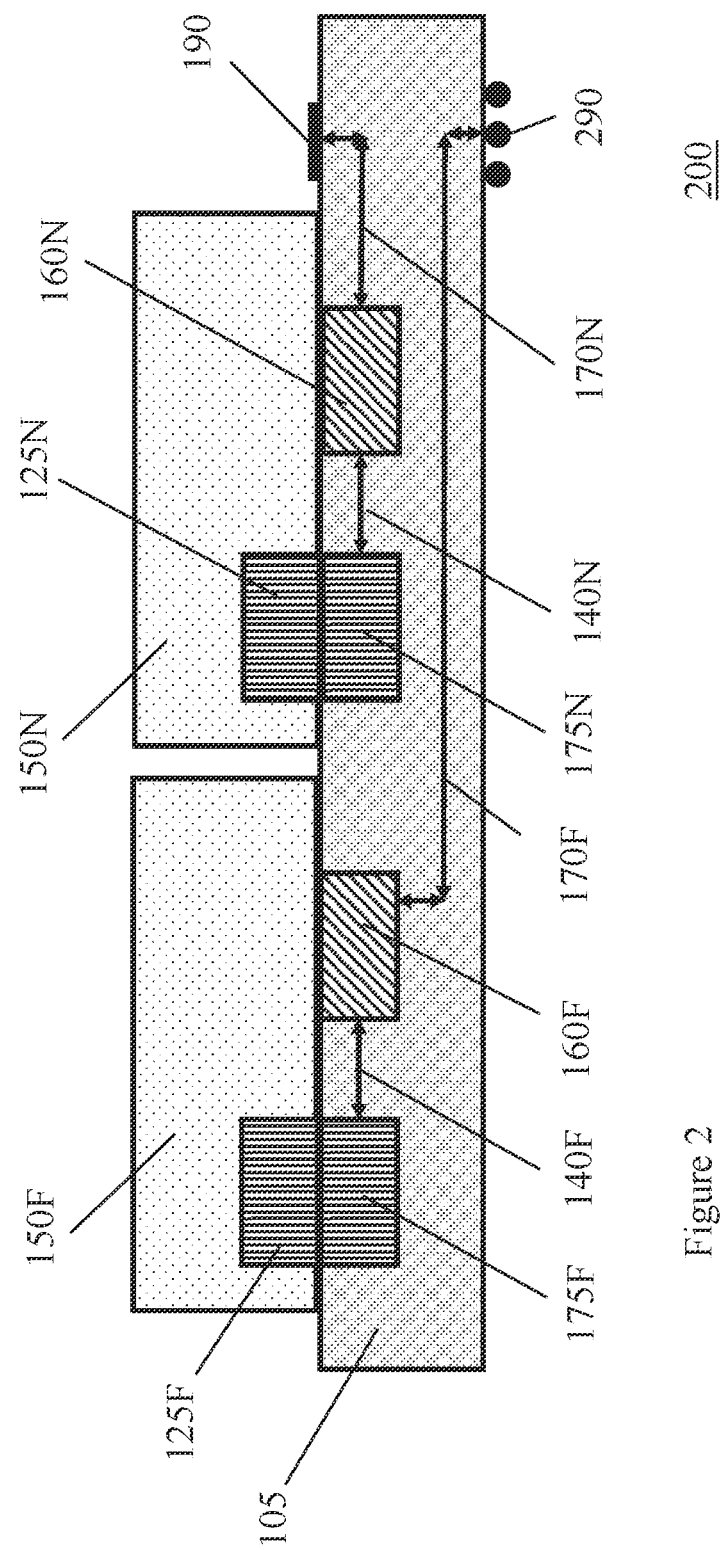
FIG. 2 is a block diagram of one embodiment of a high bandwidth memory (HBM) module with one or more HBMs/HB chips mounted on a HBM module substrate and where each of the HBMs has one or more HBM PHYs connected through a companion PHY, a SERDES and a serial communication interface to distant I/Os of different types and at different locations.

FIG. 2 is a block diagram of one embodiment of a high bandwidth memory (HBM) module 200 with two or more HBMs (and/or HB chips), typically 150, a near HBM 150N and a far HBM 150F, mounted on a HBM module substrate 105. Each of the HBMs 150N/150F has one or more HBM PHYs 125N/125F connected to a compatible companion PHY 175N/175F, respectively. A separate SERDES 160N/160F connects via a parallel link 140N/140F to one of the companion PHYs 175N/175F, respectively. Each of the SERDES 160N/160F connects over a serial connection 170N/170F to a separate, distant input/output 190/290 accessible on the module substrate 105. As an example, the distant I/O's 190/290 are shown at accessible locations on opposite surfaces of the module substrate 105. The distant I/O's are also shown as different physical connections, e.g., conductive pads and C4 solder ball arrays. Other configurations are envisioned.

As shown, the far HBM 150F connects through the parallel interface, HBM PHY 125F, through the companion PHY 175F, and then through the parallel connection 140F to the far SERDES 160F. The far SERDES 160F converts the data/information into serial format and communicates the serial data/information over the far serial connection 170F to a separate, distant serial I/O 290 located with external access on the HBM module substrate 105. In this embodiment, the distant serial I/O 290 is located on a bottom surface of the HBM module substrate 105. Other locations and configurations are envisioned.

Also as shown, the near HBM 150N connects through the parallel interface (HBM PHY) 125N, through the companion PHY 175N through the parallel connection 140N to the near SERDES 160N. The near SERDES 160N converts the parallel data/information into serial format and communicates the serial data/information over the near serial connection 170N to a separate, distant serial I/O 190 located with external access on the HBM module substrate 105. In this embodiment, the distant serial I/O 190 is located on a top surface of the HBM module substrate 105. Other locations and configurations are envisioned.

Embodiments of physical serial connections 190/290 include physical serial interface connectors like ball grid arrays (BGAs), land grid arrays, (LGAs), C4 solder balls, microbumps, pads, pins, and other known connectors.

Figure 3:
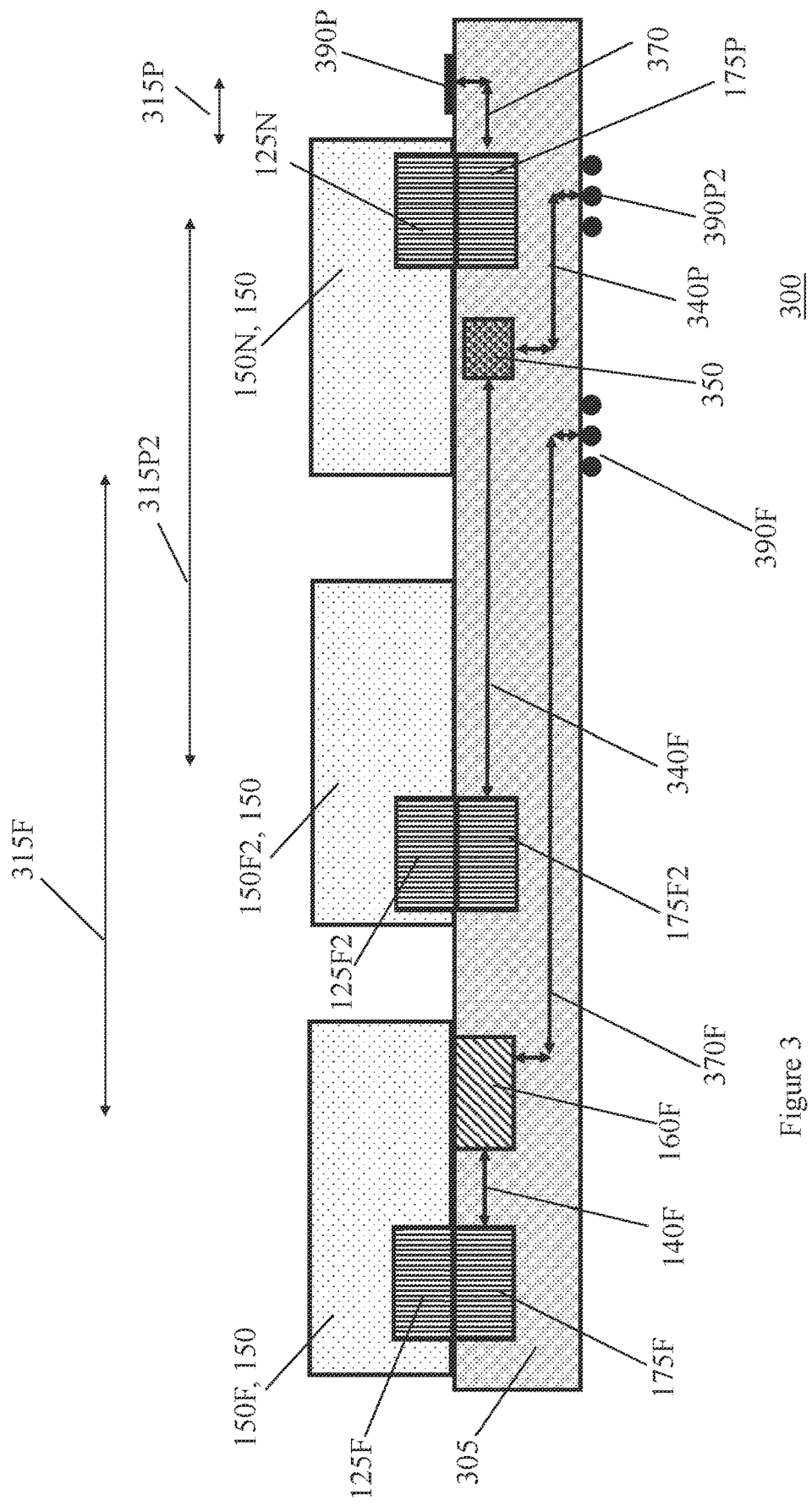
FIG. 3 is a block diagram of an alternative HBM/HB chip module with multiple HBMs, each connected to different distant I/O connections by a communication interface/connection and where two or more of the communication interfaces are different types.

FIG. 3 is a block diagram of an alternative HBM module 300 with multiple HBMs 150F/150F2/150N, typically 150, each connected to different distant I/O connections 390F/390P2/390P by a communication interface and where two or more of the communication interfaces (370F/390F, 340P/390P2, 370/390P) are different types.

An example first type of communication interface connects a HBM 150F (a far HBM, as described above) to a far distant serial I/O connection 390F. The HBM PHY 125F connects to a compatible companion PHY 175F which connects to a far SERDES 160F through a parallel link/communication connection 140F. The serial output from the far SERDES 160F connects to the distant serial I/O connection 390F through the serial link/communication connection 370F. The distant I/O connection 390F is located at a distance 315F from the far SERDES 160F on a bottom surface of the HBM module substrate 305. Other configurations are envisioned. The distance 315F can be greater than 8 mm because the connection 370F is a serial connection.

An example second type of communication interface connects a second far HBM 150F2 to a second type of distant I/O parallel connection 390P2. The second far HBM 150F2 has one or more HBM PHYs 125F2 each connected to a compatible companion PHY(s) 175F2. The companion PHYs 175F2 may or may not be located within the HBM module substrate 305. This communication interface 340F has no SERDES and therefore the data connection 340F is in a parallel format. However, since the communication distance 315P2 between the companion PHY 175F2 and the distant I/O parallel connection 390P2 is far, e.g., greater than 8 mm, the far parallel connection 340F needs one or more buffers 350 to enhance the strength of the parallel connection 340F/340P. These buffers 350 enable a usable parallel interface at the distant I/O parallel connection 390P2. By using the buffer(s) 350, conversion of the connection 340F/340P to serial format is not required to communicate over the further distance 315P2 with the distant I/O parallel connection 390P2. Buffers 350 are known.

An example third type of communication interface 370 is a direct parallel connection 370 to a third type of distant I/O parallel connection 370. A near HBM 150N has a near HBM PHY 125N connected to a compatible companion PHY 175P. The PHY 175P produces a parallel connection 370. This parallel connection 370 can directly connect to the distant I/O parallel connection 390P because the companion PHY 175P link 370 is near (e.g., less than 8 mm) to the distant I/O parallel connection 390P. In this instantiation, there is no need to convert from a parallel data format to a serial data format and back again because the parallel connection 370 from the compatible companion PHY 175P to the distant I/O parallel connection 390P is short enough so that the date transfer through the parallel connection 370 is not limited.

The HBM module 300 shown in FIG. 3 provides a variety of data connections to distant I/O connections 390F/390P2/390P on the HBM module substrate 305. Therefore, a plurality of HBM 150 and HBM 150 types (chips, chip stacks, etc.) can be mounted closely packed on the HBM module substrate 305 while providing distant I/O connections 390F/390P2/390P of different types and at different locations on the HBM module substrate 305. Different communication distances 315F/315P2/315P are also enabled. For example, a HBM 150 can be near or far from a distant I/O connection 390F/390P2/390P and can be connected by a serial or parallel connection 370F/340P/370 depending on the configuration of the HBM module 300.

As described below, HBM modules 300 like this can be used with package substrates and a central die(s) to enable large numbers of HBMs 150 to be densely packed in proximity to and connected with one or more central dies. These HBM module structures 100/200/300 enable creation of high data bandwidth packages using standard HBMs 150 and with little or no extra circuitry. The HBM module structures 100/300/300 extend the communication distance 115/315F/315P2/315P from the HBM PHY 125 to a standard distant I/O, e.g., 190/390F/390P2/390P.

Figure 4:
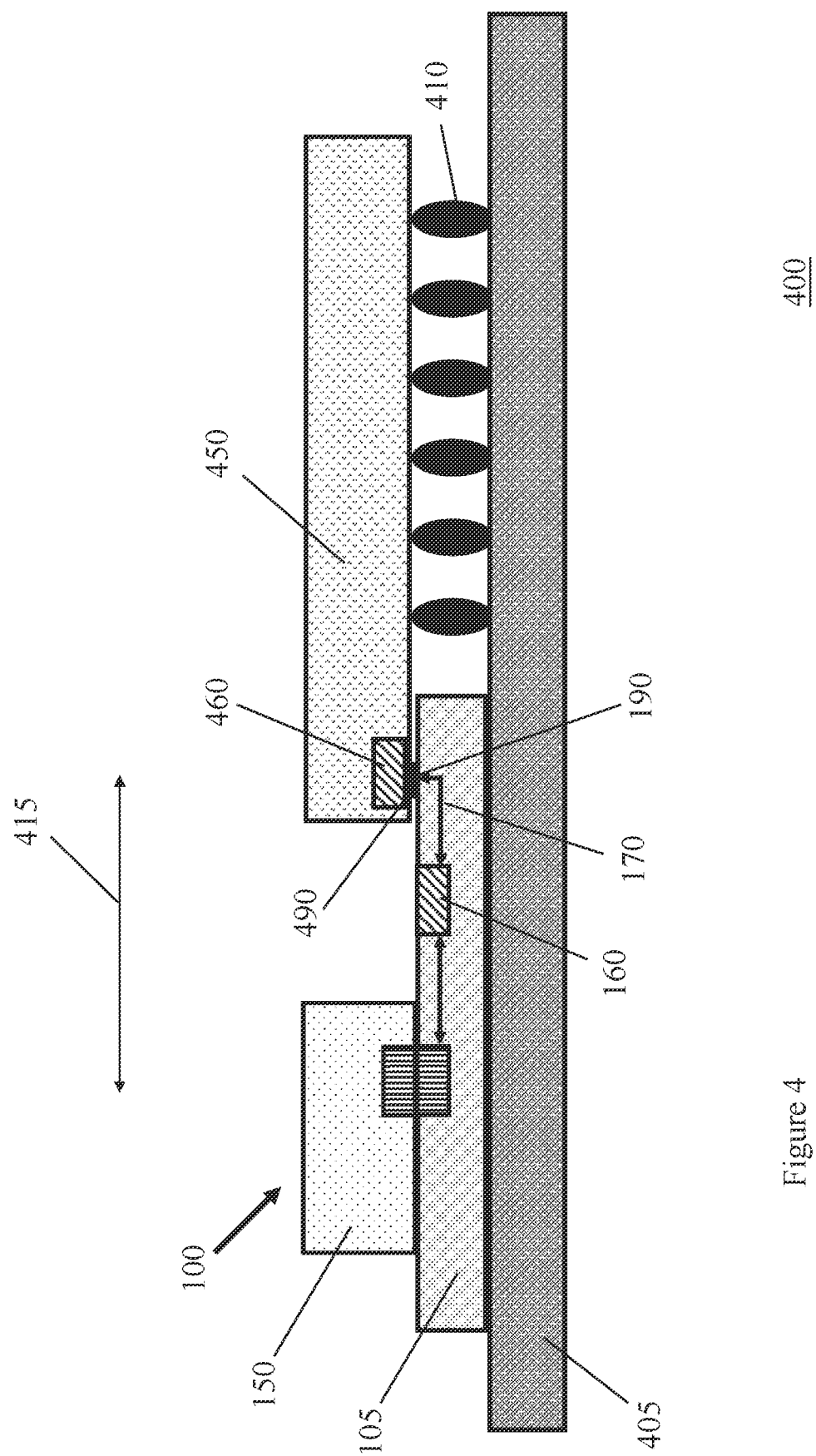
FIG. 4 is a block diagram of one embodiment of a HBM package with one or more HBM modules and one or more central dies mounted on a package substrate, where one or more distant I/Os on one or more of the HBM modules interfaces/connects with a corresponding data I/O interface on one of the central dies, e.g., a central die SERDES.

FIG. 4 is a block diagram of one embodiment of a HBM package with one or more HBM modules 100/200/300 mounted on a package substrate 405 where one or more distant I/O, e.g., 190, on one or more of the HBM modules 100/200/300 interfaces/connects with a distant I/O interface 490 and to a central die SERDES 460 on a central die 450 also mounted on the package substrate 405. Note that one HBM module 100 is shown in FIG. 4 mounted on the package substrate 405. However, it is understood that other instantiations of HBM modules, e.g., 200/300, etc. and/or any number of combinations of the different types of HBM modules 100/200/300 can be used.

The package substrate 405 can be any known substrate 405 made of any known substrate material. For example, package substrates 405 are made of materials such as epoxy, resin, dielectric polymer, polyimide, polyimide alloy or compounds, ceramic, semiconductors, silicon, and/or other similar materials. One preferred material for package substrates 405 are laminates.

In some embodiments, Integrated Thin Film High Density Organic Packages, iTHOPs, are used as one or more of the package substrates 405. "i-THOP" is a registered trademark of SHINKO ELECTRIC INDUSTRIES CO., LTD.

iTHOP is just one example of an advanced laminate. There are numerous advanced laminates that are either classified as 2.1D, 2.3D, or organic interposers. Advanced laminates also include laminated substrates with one or more patches of high-density interconnects. The common theme is the incorporation of finer pitch organic routing directly on a laminate or bonding onto a laminate. The finer pitch wiring may be widespread or located in patches on the laminate. For example, iTHOPs enable embodiments disclosed in FIG. 5 below, whereby a near HBM 150B can use advanced laminate routing 405 to connect to a central die 550, and a distant HBM 100A can use either a 3D or 2.5D SERDES chip (mounted on package substrate 405, e.g., the iTHOP) to enable communication to the central die 550. And the SERDES high speed interconnects could use standard laminate routing or fine pitch routing depending on the scenario.

Generally, the package substrates 405 organize, hold, and carry one or more HBM modules 100/200/300 with one or more central dies 450. Other active (e.g., transistors, SERDES, etc.) and inactive (e.g., capacitors, wiring, and resistors) components can be mounted on and/or within the package substrates 405. The package substrates 405 enable positioning and packing the HBM modules 100/200/300 so that serial and/or parallel data connections are made between one or more of the HBM modules and one or more of the central dies 450 to enable denser packing of HBMs 150 in the HBM modules 100/200/300 in proximity to and in connection with central dies 450 on the package substrates 405. Accordingly, high bandwidth data transfer is achieved between the HBMs 150 and the central dies 450 through the connected serial and/or parallel data connections, e.g., 190/490.

In the particular non-limiting embodiment 400 shown in FIG. 4, a serial connection 170 between the HBM module SERDES 160 and a central die SERDES 460 is made 490 at a distant I/O connection 190. Since the connection 170 is a serial link 170 to the distant I/O 190, the serial link 170 connection 170 can extend over a longer communication distance 415 and enables the HBM 150 connected to the central die 450 to be a far communication distance 415 from the central die 450. Increasing the communication distance 415 enables more HBMs 150 to be packed more densely in close proximity to the central die(s) 450.

In some embodiments, connections 410 are made from the central die 450 to circuitry on and/or within the package substrate 405.

Figure 5:
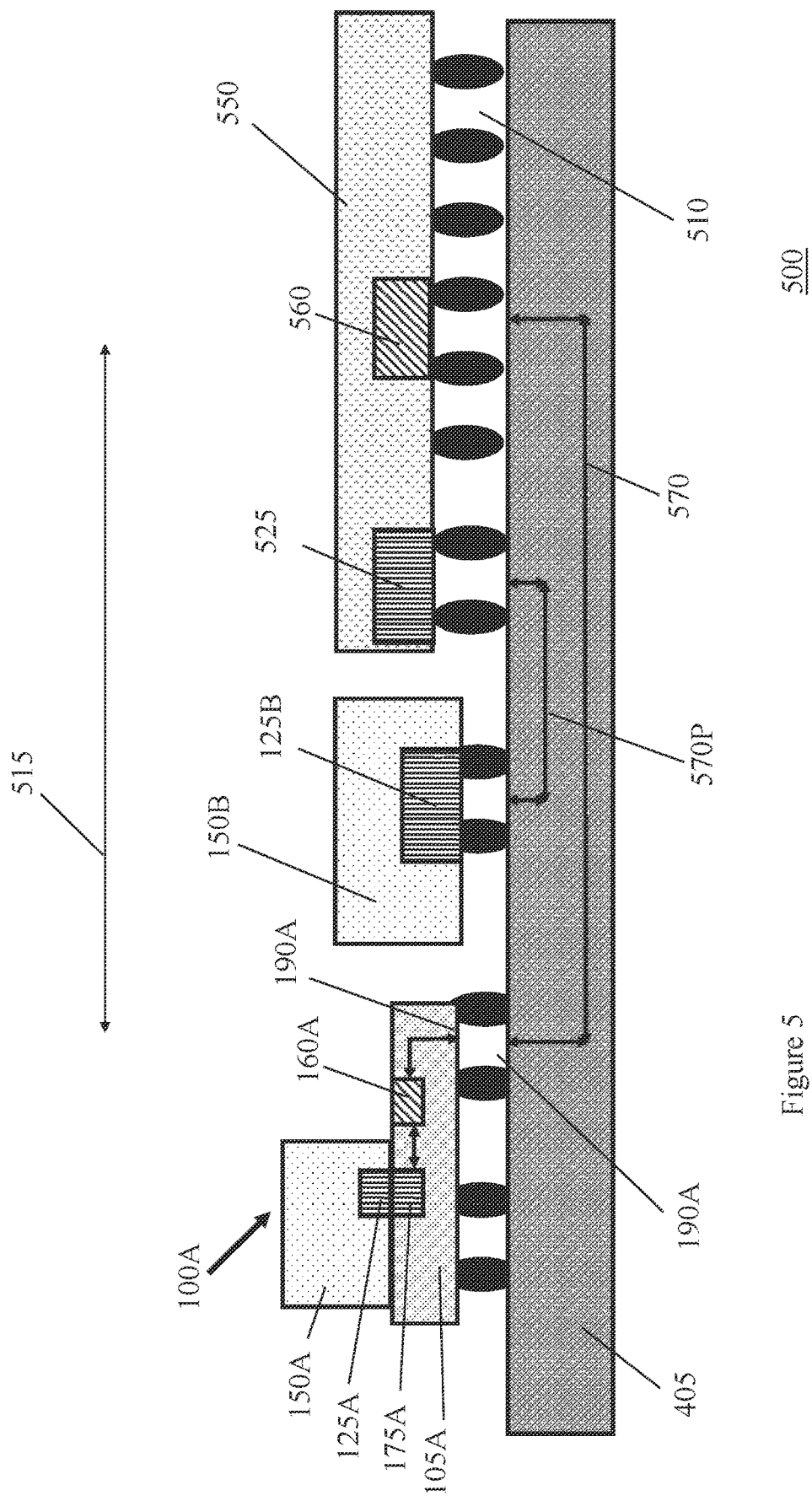
FIG. 5 is a block diagram of alternative embodiments of a HBM package with a combination of serial and parallel data connections between one or more of the HBMs and HBM modules and a central die/chip mounted on a package substrate.

FIG. 5 is a block diagram of an alternative embodiment of a HBM package 500 with a combination of serial 190A/570 and parallel data connections 125B/570P/525 between one or more HBMs 150B and HBM modules, e.g., 100A, and a central die/chip 550.

In the example embodiment 500, there is a HBM module 100A, a HBM 150B, and a central die 550 mounted on a package substrate 405.

The HBM module 100A has one or more HBMs 150A carried on a module substrate 105A. Each HBM 150A has a HBM PHY 125A connected through a companion PHY 175A to a HBM module SERDES 160A. The SERDES 160A has a serial connection to a distant I/O connection 190A. The distant I/O connection 190A connects through a serial communication link 570 to a central die SERDES 560 that is a compatible connection with HBM module SERDES 160A.

The "far" communication distance 515 is enabled by the serial communication link 570 between the distant I/O connection 190A on the HBM module 100A and the central die SERDES 560. Enabling the placement of the HBM module 100A at a far communication distance 515 from the central die SERDES 560 enables more dense packing of HBMs 150A/150B in proximity to the central die 550.

For example, HBM 150B is mounted on the package substrate 405 near the central die 550. As such, the HBM PHY 125B can be directly connected by a parallel communication link 570P to a compatible PHY 525 on the central die 550. Accordingly, HBM 150B can be mounted in close proximity to the central die 550. However, due to the serial communication link 570, the HBM 150A on the HBM module 100A can also be connected to 570/560 to and in proximity 515 with the central die 550.

Thus, the HBMs 150A and 150B are densely packed together in proximity to the central die 550. Design of the HBM module 100A and companion PHY 175A enables compatible connections of serial 570 and/or parallel data links 570P with the central die 550 by using commodity HBMs 150.

In some embodiments, connections 510 are made from the central die 550 to circuitry on and/or within the package substrate 405.

Figure 6:
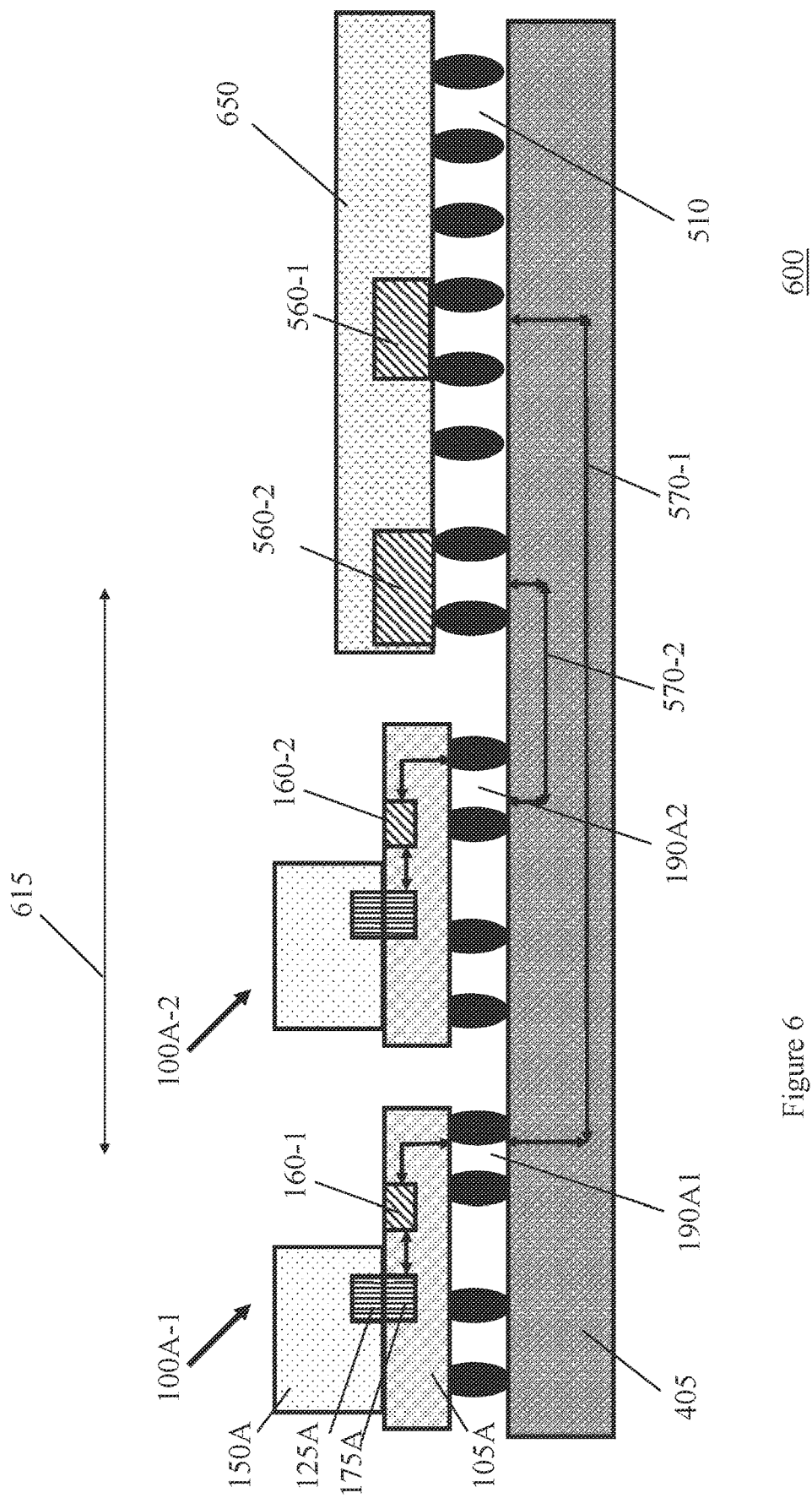
FIG. 6 is a block diagram of an alternative embodiment of a HBM package with multiple serial data connections between one or more HBMs modules and a central die/chip mounted on a package substrate.

FIG. 6 is a block diagram of an alternative embodiment 600 of an HBM package 600 with two or more HBM modules 100A each with a serial communication link 570-1 and 570-2 to a central die 650.

As before, the HBM modules 100A-1/100A-2 have one or more HBMs 150A carried on a module substrate 105A. Each HBM 150A has a HBM SERDES PHY 125A connected through a companion PHY 175A to a HBM module SERDES 160-1. The SERDES 160-1 has a serial connection to a distant I/O connection 190A1. The distant I/O connection 190A1 connects through a serial communication link 570-1 to a die SERDES 560-1 on the central die 650 that is a compatible connection with HBM module SERDES 160-1.

The HBM module 100A-1 configuration can be repeated multiple times, as shown in HBM module 100-A2 (with some of the element numbers removed for clarity).

Since all the HBM modules 100A in this embodiment have serial communication links 570-1/570-2 with the central die 650, each of the HBM modules 100A-1/100A-2 can have a far communication distance 615 with respect to the central die 650. This enables the HBM modules, typically 100A-1, to be packed together with little or no consideration for the communication distance 615.

Figure 7:
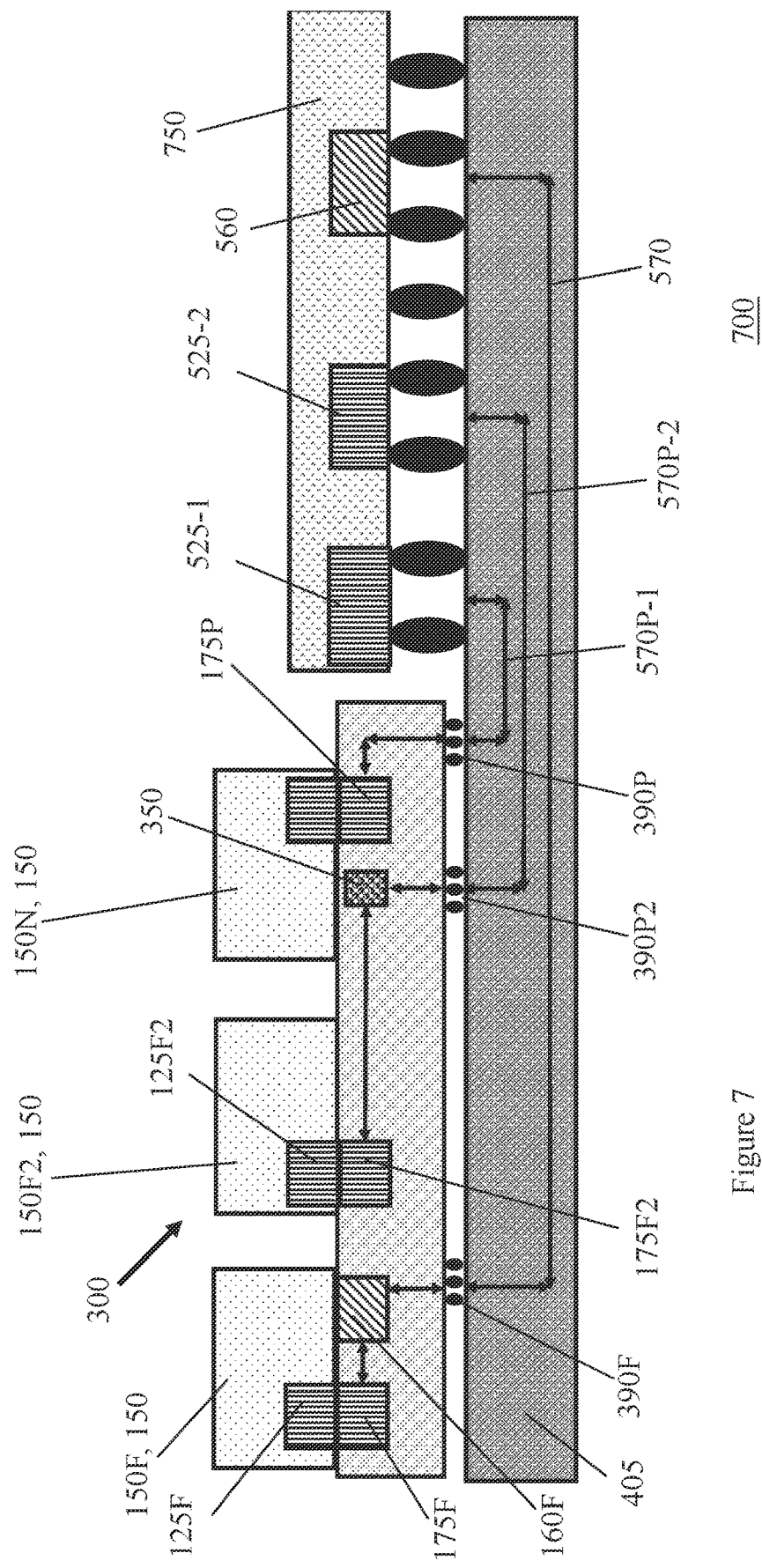
FIG. 7 is a block diagram of an alternative embodiment of a HBM package with a combination of serial and parallel data connections between a HBM module and a central die/chip.

FIG. 7 is a block diagram of an alternative embodiment of a HBM package 700 with a combination of serial 570 and parallel 570P-1/570P-2 data connections between an HBM module 300 and a central die/chip 750. In this embodiment 700, the HBM module 300 has a variety of communication link types 570P-1/570P-2/570 and the HBMs 150 are located at various near and far locations from the central die 750. See the discussion of FIG. 3.

For example, HBM 150F has a serial distant I/O connection 390F located at a far communication distance from the compatible die SERDES 560 to which it connects. HBM 150F2 has a parallel distant I/O connection 390P2 connecting with a parallel communication link 570P-2 that is buffered 350 so that the parallel communication link 570P-2 can function over a longer communication distance to connect to die PHY 525-2. HBM 150N has a companion PHY 175P that is close enough to the die PHY 525-1 so that a parallel communication link 570P-1 can connect the distant I/O connection 390P and the die PHY 525-1.

Embodiment 700 is an example of how numerous HBMs 150 can be packed on a HBM module 300 and configured in combinations of complex positions, connections (serial and/or parallel) to central dies, with varying (near or far) communication distances to/from the central dies with one pre-assembled HBM modules, e.g., 300, that uses standard, off-the-shelf HBMs 150.

Figure 8:
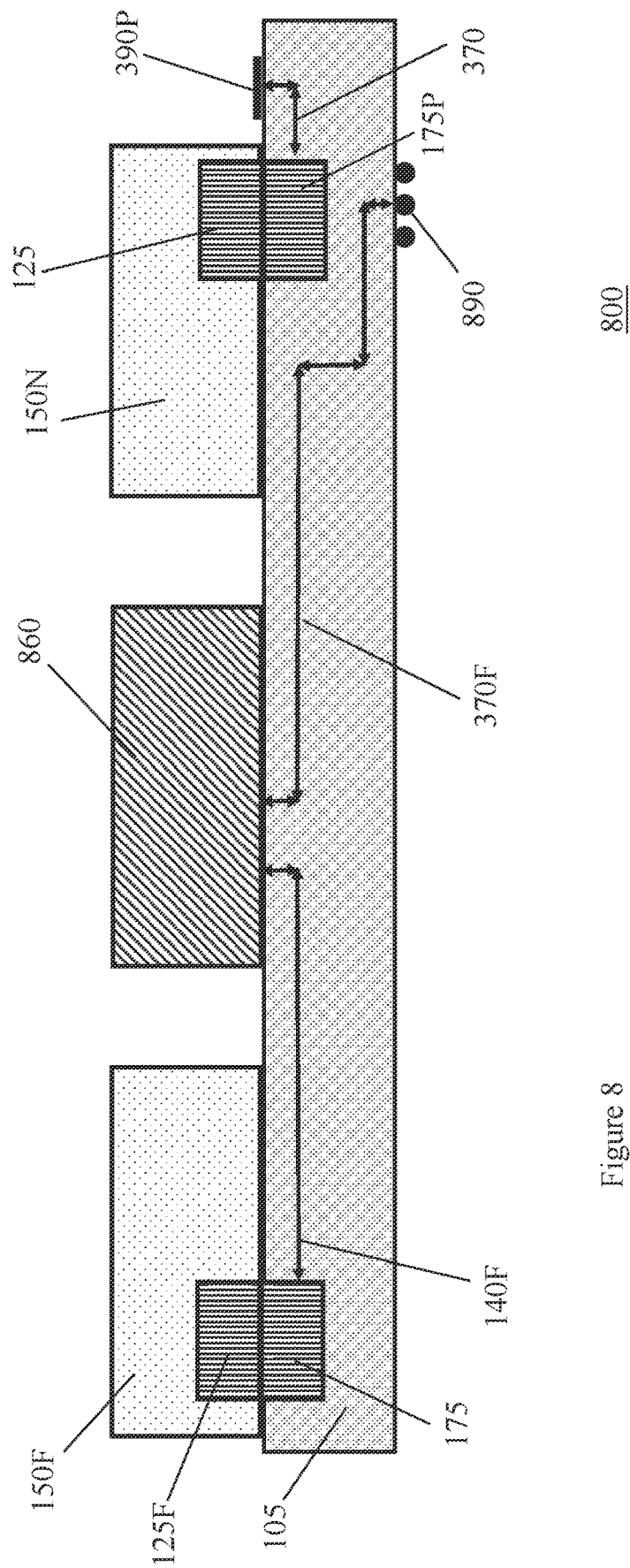
FIG. 8 is a block diagram of one alternative embodiment of a HBM module with a SERDES mounted on the HBM module substrate.

FIG. 8 is a block diagram of one alternative embodiment of a HBM module 800 with a SERDES 860 mounted on the HBM module substrate 105. In this embodiment, the HBM 150F has a HBM PHY 125F that connects through a parallel communication link 140F to the surface-mounted SERDES 860. The surface-mounted SERDES 860 then in turn connects through serial communications link 370F to a distant SERDES I/O 890.

In addition, a near HBM 150N with a HBM PHY 125 is connected to a compatible companion PHY 175P. The companion PHY 175P produces a parallel connection 370. This parallel connection 370 can directly connect to the distant I/O parallel connection 390P because the companion PHY 175P link 370 is near (e.g., less than 8 mm) to the distant I/O parallel connection 390P.

The descriptions of the various embodiments of the present invention have been presented for purposes of illustration but are not intended to be exhaustive or limited to the embodiments disclosed. Given this disclosure, many modifications and variations will be apparent to those of ordinary skill in the art without departing from the scope and spirit of the described embodiments. For example, the semiconductor devices, structures, and methods disclosed in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, expert and artificial intelligence systems, functional circuitry, etc. Systems and hardware incorporating the semiconductor devices are contemplated embodiments of the invention.

The terminology used herein was chosen to explain the principles of the embodiments and the practical application or technical improvement over technologies found in the marketplace or to otherwise enable others of ordinary skill in the art to understand the embodiments disclosed herein. Devices, components, elements, features, apparatus, systems, structures, techniques, and methods described with different terminology that perform substantially the same function, work in the substantial the same way, have substantially the same use, and/or perform the similar steps are contemplated as embodiments of this invention.

We claim:

1. A semiconductor memory module comprising:
   a module substrate comprising active components and passive components, wherein the active components comprise companion physical layers, a memory controller, a SERDES, and an I/O connection,
   wherein the SERDES and the I/O connection are communicatively coupled with a serial communication link, and
   wherein the I/O connection is located a communication distance greater than 8 mm from the companion physical layers;
   a high bandwidth semiconductor chip comprising a physical layer physically secured to the module substrate, wherein the physical layer of the high bandwidth semiconductor chip is communicatively coupled to the SERDES via a companion parallel connection, the companion physical layers, a parallel communication link, and the memory controller.

2. The semiconductor memory module according to claim 1, wherein the module substrate is an active bridge.

3. The semiconductor memory module according to claim 1, wherein the module substrate is a passive bridge.

4. The semiconductor memory module according to claim 1, wherein the SERDES is communicatively coupled to the I/O connection via the serial communication link.

5. The semiconductor memory module according to claim 1, wherein the companion parallel connection provides an interface between the physical layer of the high bandwidth semiconductor chip and the companion physical layers of the module substrate.

6. The semiconductor memory module according to claim 1, wherein the companion physical layers, the parallel communication link, the memory controller, and the SERDES are located within the module substrate.

7. The semiconductor memory module according to claim 1, wherein the physical layer is located within the high bandwidth semiconductor chip.

8. A semiconductor memory module comprising:
   a module substrate comprising active components and passive components, wherein the active components comprise companion physical layers, a SERDES, and an I/O connection,
   wherein the SERDES and the I/O connection are communicatively coupled with a serial communication link, and wherein the I/O connection is located a communication distance greater than 8 mm from the companion physical layers;

a high bandwidth semiconductor chip comprising a physical layer physically secured to the module substrate, wherein the physical layer of the high bandwidth semiconductor chip is communicatively coupled to the SERDES via a companion parallel connection, the companion physical layers, and a parallel communication link.

9. The semiconductor memory module according to claim 8, wherein the module substrate is an active bridge.

10. The semiconductor memory module according to claim 8, wherein the module substrate is a passive bridge.

11. The semiconductor memory module according to claim 8, wherein the SERDES is communicatively coupled to the I/O connection via the serial communication link.

12. The semiconductor memory module according to claim 8, wherein the companion parallel connection provides an interface between the physical layer of the high bandwidth semiconductor chip and the companion physical layers of the module substrate.

13. The semiconductor memory module according to claim 8, wherein the companion physical layers, the parallel communication link, and the SERDES are located within the module substrate.

14. The semiconductor memory module according to claim 8, wherein the physical layer is located within the high bandwidth semiconductor chip.

15. A semiconductor memory module comprising:
a module substrate comprising active components and passive components, wherein the active components comprise companion physical layers, a SERDES, and an I/O connection, wherein the SERDES and the I/O connection are communicatively coupled with a serial communication link, and a high bandwidth semiconductor chip comprising a physical layer physically secured to the module substrate, wherein the physical layer of the high bandwidth semiconductor chip is communicatively coupled to the SERDES via a companion parallel connection, the companion physical layers, and a parallel communication link.

16. The semiconductor memory module according to claim 15, wherein the module substrate is an active bridge.

17. The semiconductor memory module according to claim 15, wherein the module substrate is a passive bridge.

18. The semiconductor memory module according to claim 15, wherein the SERDES is communicatively coupled to the I/O connection via the serial communication link.

19. The semiconductor memory module according to claim 15, wherein the companion parallel connection provides an interface between the physical layer of the high bandwidth semiconductor chip and the companion physical layers of the module substrate.

20. The semiconductor memory module according to claim 15, wherein the companion physical layers, the parallel communication link, and the SERDES are located within the module substrate.

21. The semiconductor memory module according to claim 15, wherein the physical layer is located within the high bandwidth semiconductor chip.

* * * * *